(12) United States Patent
Cramer

(10) Patent No.: US 7,460,237 B1
(45) Date of Patent: Dec. 2, 2008

(54) INSPECTION METHOD AND APPARATUS, LITHOGRAPHIC APPARATUS, LITHOGRAPHIC PROCESSING CELL AND DEVICE MANUFACTURING METHOD

(75) Inventor: Hugo Augustinus Joseph Cramer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/882,610

(22) Filed: Aug. 2, 2007

(51) Int. Cl.
*G01N 21/55* (2006.01)

(52) U.S. Cl. ............... 356/445; 356/243.1; 355/55; 702/27; 702/159

(58) Field of Classification Search ... 356/237.1–237.5, 356/445–448, 601–630, 243.1–243.8; 355/53, 355/55; 702/127, 172, 27, 159
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,795,193 B2 * | 9/2004 | Schulz | 356/445 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,997,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 2004/0119970 A1 | 6/2004 | Dusa et al. | 356/237.1 |
| 2005/0185174 A1* | 8/2005 | Laan et al. | 356/243.1 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |
| 2007/0222979 A1* | 9/2007 | Van Der Laan et al. | 356/243.1 |
| 2008/0088832 A1* | 4/2008 | Cramer et al. | 356/237.4 |

FOREIGN PATENT DOCUMENTS

WO  WO 2005/081069  9/2005

\* cited by examiner

*Primary Examiner*—Hoa Q Pham
(74) *Attorney, Agent, or Firm*—Sterne, Kessler, Goldstein & Fox P.L.L.C.

(57) ABSTRACT

In a method of determining a structure parameter of a target pattern in a lithographic process, a series of calibration spectra are calculated from a reference pattern. Spectral analysis is performed on each calculated spectra, the spectral components and associated weighting being derived and stored in a library or used as the basis of an iterative search method. A spectrum is measured from the target pattern and spectral analysis of the measured spectrum is performed. The derived weighting factors of the principal components are compared with the weighting factors of the measured spectrum to determine the structure parameter.

16 Claims, 13 Drawing Sheets

INSPECTION METHOD AND APPARATUS, LITHOGRAPHIC APPARATUS, LITHOGRAPHIC PROCESSING CELL AND DEVICE MANUFACTURING METHOD

FIELD

The present invention relates to a method of inspection usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, one or more parameters of the patterned substrate are typically measured, for example the overlay error between successive layers formed in or on the substrate. There are various techniques for making measurements of the microscopic structures formed in a lithographic process, including the use of a scanning electron microscope and various specialized tools. One form of specialized inspection tool is a scatterometer in which a beam of radiation is directed onto a target on the surface of the substrate and one or more properties of the scattered or reflected beam are measured. By comparing one or more properties of the beam before and after it has been reflected or scattered by the substrate, one or more properties of the substrate may be determined. This may be done, for example, by comparing the reflected beam with theoretical reflected beams calculated using a model of the substrate and searching for the model that gives the best fit between measured and calculated reflected beams. Typically a parameterized generic model is used and the parameters of the model, for example width, height and sidewall angle of the pattern of the substrate, are varied until the best match is obtained. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity (or intensity ratio and phase difference in case of an ellipsometric configuration) of the scattered radiation as a function of angle. Alternatively, measurement signals of different wavelengths may be measured separately and combined at an analysis stage. Polarized radiation may be used to generate more than one spectrum from the same substrate.

In order to determine one or more parameters of the substrate, a best match is typically found between the theoretical spectrum produced from a model of the substrate and the measured spectrum produced by the reflected beam as a function of either wavelength (spectroscopic scatterometer) or angle (angularly resolved scatterometer). To find the best match there are basically two methods, which may be combined. The first method is an iterative search method, where a first set of model parameters is used to calculate a first spectrum, a comparison being made with the measured spectrum. Then a second set of model parameters is selected, a second spectrum is calculated and a comparison of the second spectrum is made with the measured spectrum. These steps are repeated with the goal of finding the set of parameters that gives the best matching spectrum. Typically, the information from the comparison is used to steer the selection of the subsequent set of parameters. This process is known as an iterative search technique. The model with the set of parameters that gives the best match is considered to be the best description of the measured substrate.

The second method is to make a library of spectra, each spectrum corresponding to a specific set of model parameters. Typically the sets of model parameters are chosen to cover all or almost all possible variations of substrate properties. The measured spectrum is compared to the spectra in the library. Similarly to the iterative search method, the model with the set of parameters corresponding to the spectrum that gives the best match is considered to be the best description of the measured substrate. Interpolation techniques may be used to determine more accurately the best set of parameters in this library search technique.

In both methods, sufficient data points (wavelengths and/or angles) in the calculated spectrum should be used in order to enable an accurate match between the stored spectra and the measured spectrum, typically between 80 up to 800 data points or more for each spectrum. Using an iterative method, each iteration for each parameter value would involve calculation at 80 or more data points. This is multiplied by the number of iterations needed to obtain the correct profile parameters. Thus typically more than 300 calculations may be required. In practice this leads to a compromise between accuracy and speed of processing. In the library approach, there is a similar compromise between accuracy and the time required to set up the library.

SUMMARY

It is desirable, for example, to provide a method of determining at least one process parameter of a lithographic process in which measured spectra are compared with calculated spectra, in which the calculation of the spectra is carried out more efficiently, without a corresponding reduction in accuracy.

According to a first aspect of the invention there is provided a method of determining a structure parameter of a target pattern in a lithographic process used to manufacture a device layer on a substrate, the method comprising:

calculating a series of calibration spectra from a reference pattern, each spectra being calculated using a different known value of a structure parameter of the reference pattern;

performing spectral analysis on each calculated calibration spectra, for a selected number of points of the spectra, to obtain a common set of spectral components and a plurality of first sets of weighting factors, each first set of weighting factors representing one calculated spectrum;

measuring a target spectrum produced by directing a beam of radiation onto the target pattern;

performing spectral analysis on the measured target spectrum using the common set of spectral components obtained from the spectral analysis of the calculated calibration spectra to obtain a second set of weighting factors representing the measured target spectrum;

comparing a representation of the first set of weighting factors and a representation of the second set of weighting factors; and using the comparison to derive a value for the structure parameter of the target pattern.

According to a further aspect of the invention, there is provided an inspection apparatus configured to determine a value of a parameter of a lithographic process used to manufacture a device layer on a substrate, the apparatus comprising:

a calculation system arranged to calculate a series of calibration spectra from a reference pattern, each spectra being calculated using a different known value of a structure parameter of the reference pattern;

a first analysis system arranged to perform spectral analysis on each calculated calibration spectra, for a selected number of points of the spectra, to obtain a common set of spectral components and a plurality of first sets of weighting factors, each first set of weighting factors representing one calculated spectrum;

a measurement system arranged to direct a beam of radiation onto a target pattern on a substrate and to measure the spectrum;

a second analysis system arranged to perform spectral analysis on the measured spectrum using the common set of spectral components obtained from the spectral analysis of the calculated calibration spectra to obtain a second set of weighting factors representing the measured spectrum;

a comparison arrangement arranged to compare a representation of the first set of weighting factors and a representation of the second set of weighting factors; and a derivation arrangement arranged to use the output of the comparison arrangement to derive the value for the parameter of the lithographic process.

According to a further aspect of the invention, there is provided a computer program for implementing a method of determining a structure parameter of a target pattern in a lithographic process used to manufacture a device layer on a substrate, the method comprising:

calculating a series of calibration spectra from a reference pattern, each spectra being calculated using a different known value of a structure parameter of the reference pattern;

performing spectral analysis on each calculated calibration spectra, for a selected number of points of the spectra, to obtain a common set of spectral components and a plurality of first sets of weighting factors, each first set of weighting factors representing one calculated spectrum;

performing spectral analysis on a spectrum measured from a target, using the common set of spectral components obtained from the spectral analysis of the calculated calibration spectra to obtain a second set of weighting factors representing the measured spectrum;

comparing a representation of the first set of weighting factors and a representation of the second set of weighting factors; and using the comparison to derive a value for the structure parameter of the target pattern.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
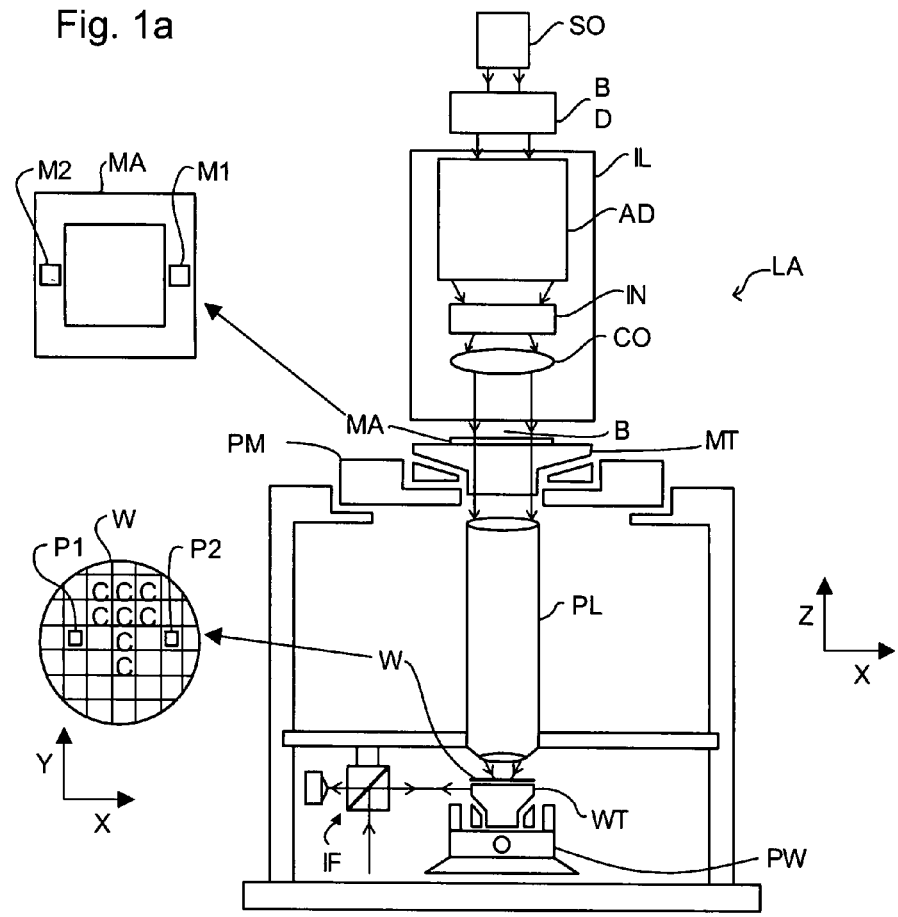
FIG. 1a depicts a lithographic apparatus.

FIG. 1a schematically depicts a lithographic apparatus. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device.

The term "patterning device" used herein should be broadly interpret as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table MT), and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
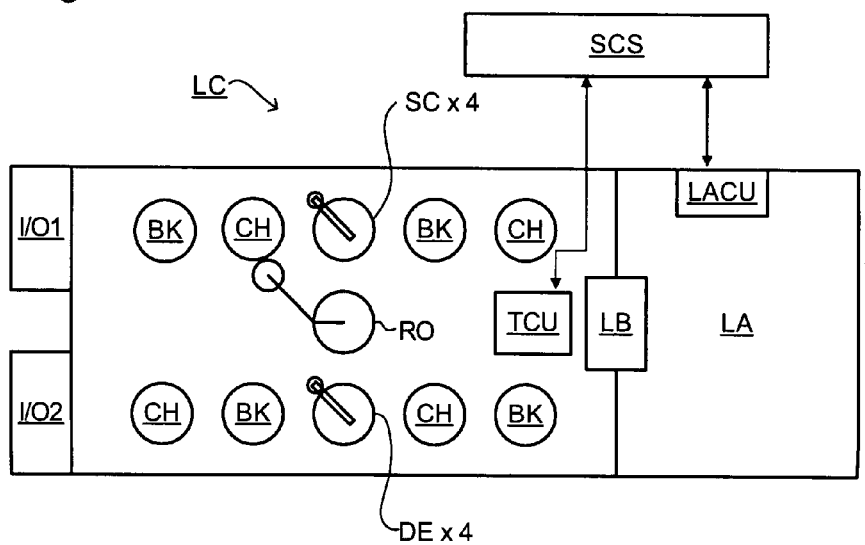
FIG. 1b depicts a lithographic cell or cluster.

As shown in FIG. 1b, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

Figure 2:
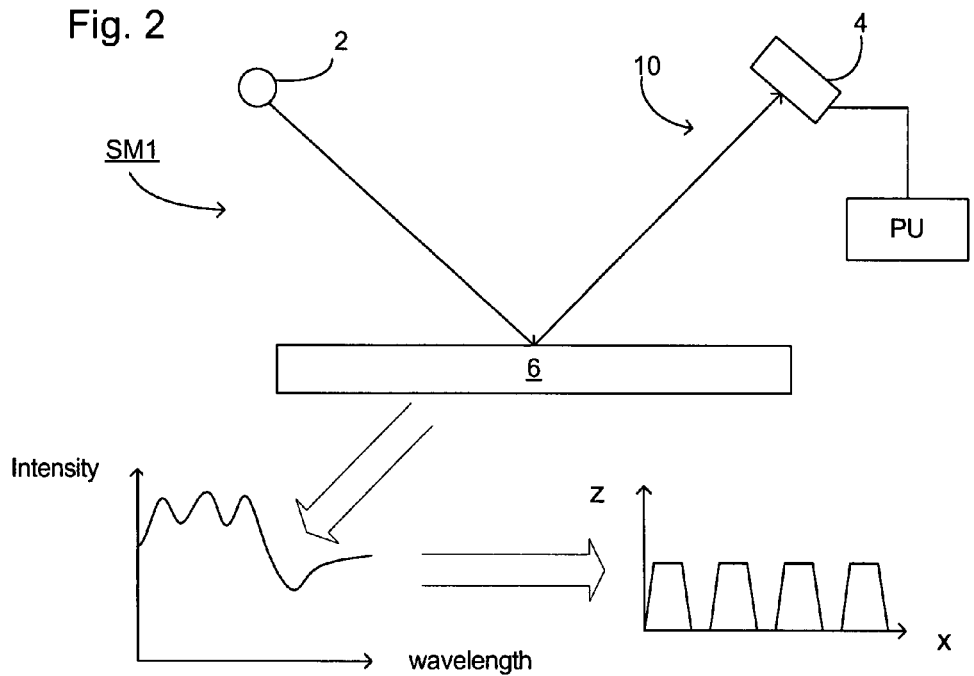
FIG. 2 depicts a first scatterometer.

FIG. 2 depicts a scatterometer SM1 according to an embodiment of the invention. It comprises a broadband (white light) radiation projector 2 which projects radiation onto a substrate 6. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
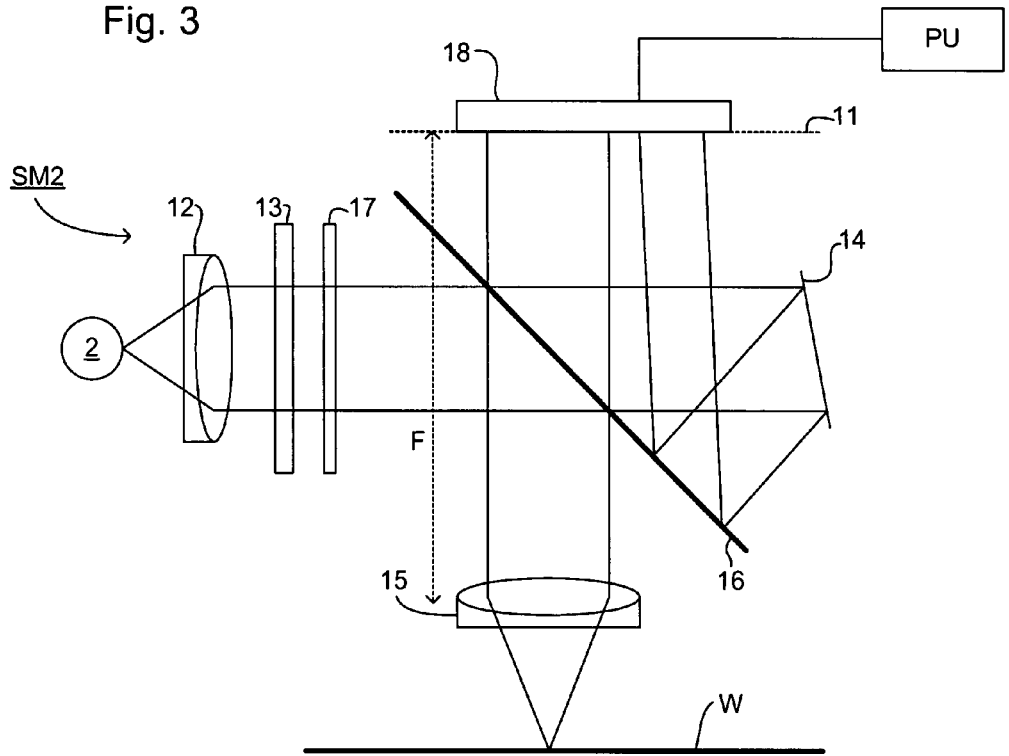
FIG. 3 depicts a second scatterometer.

Another scatterometer SM2 according to an embodiment of the invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector

18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic- and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

In any of the scatterometers described above, the target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes.

FIRST EMBODIMENT

Figure 4:
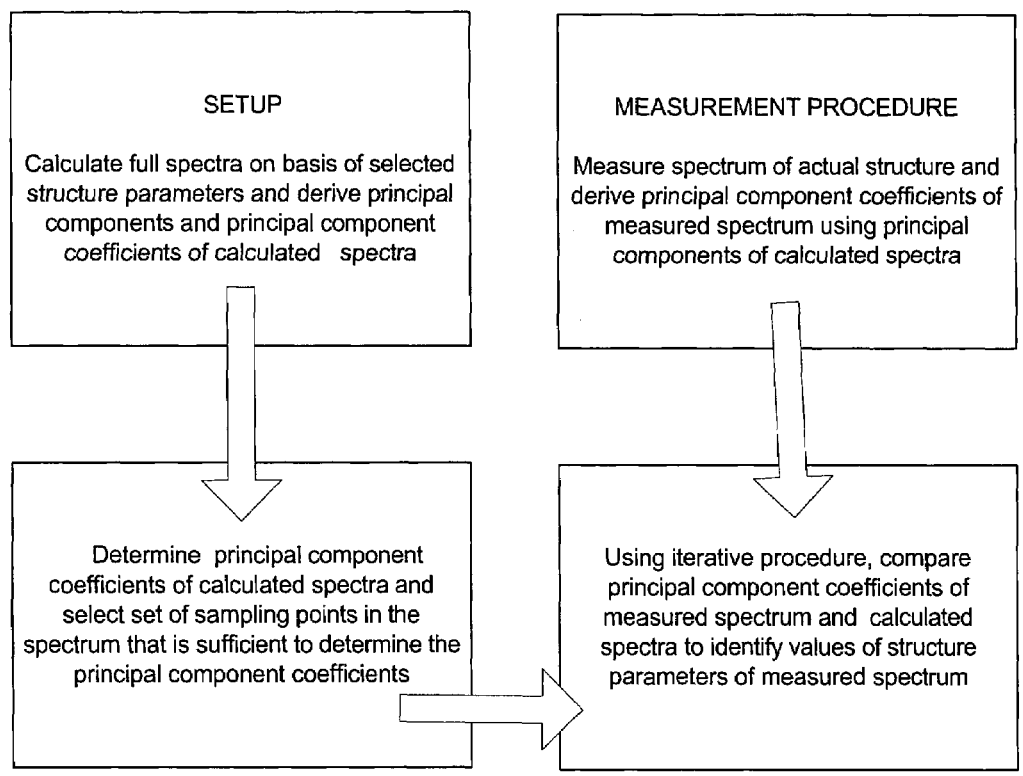
FIG. 4 depicts an overview of a method according to an embodiment of the invention.

In a first embodiment to be described, an iterative search method is used to identify the values of the structure parameters of a measured spectrum. As depicted in the overview shown in FIG. 4, in a set up procedure, the principal components of a set of modeled spectra at a selected set of sampling points are determined and in the measurement procedure, the principal component coefficients are used as the basis of an iterative procedure to identify the values of the structure parameters of the measured spectrum.

Figure 5:
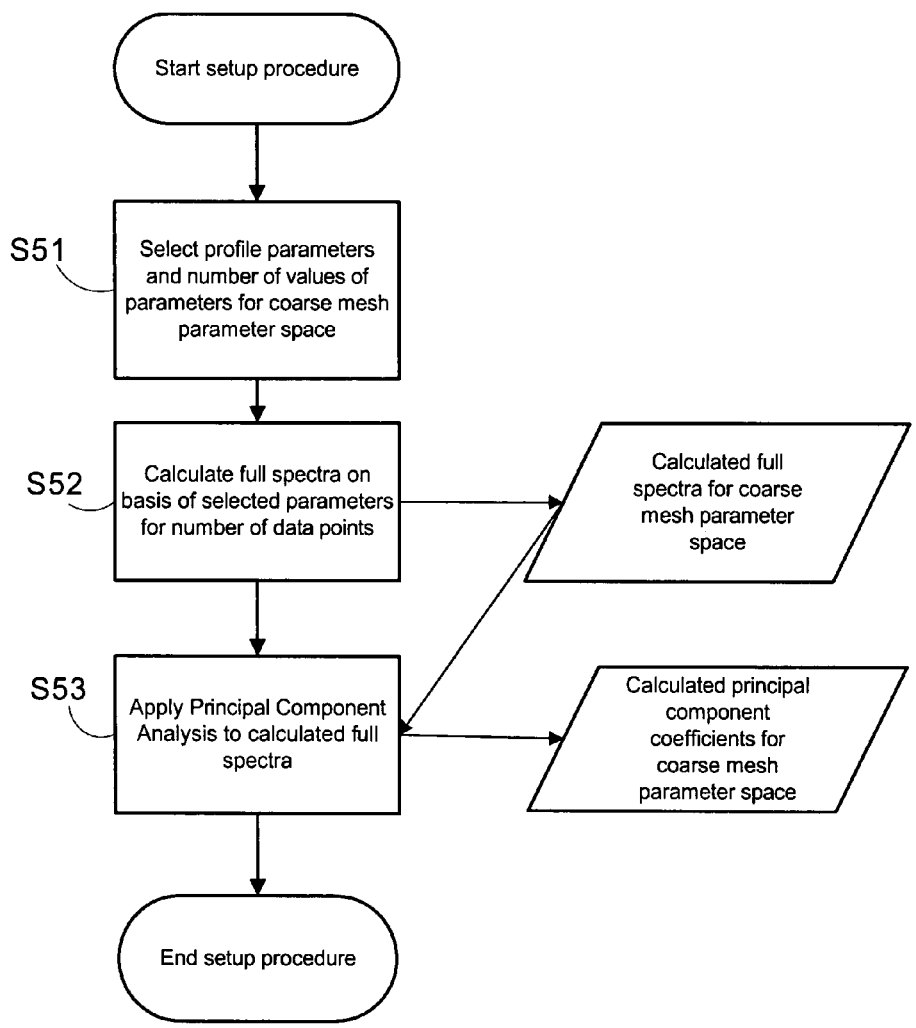
FIG. 5 depicts the set up procedure of the method according to an embodiment of the invention.

Referring now also to FIG. 5, the set up procedure is depicted in more detail. In step S51 a number of profile parameters are selected to form the basis of the spectrum to be modeled. Examples of such parameters are line width, line height, sidewall angle of the target, together with the thickness of the underlying layers, and the optical constants of materials which interact with the radiation beam 2 shown in FIG. 2. The values of each parameter to form a coarse mesh parameter space are also selected. The values can form a regular mesh but a method in accordance with an embodiment of the invention is not limited to the formation of a regular mesh.

Turning now to step S52, a set of spectra on the basis of the coarse mesh parameter space are calculated, using a diffraction modeling algorithm, such as Rigorous Coupled Wave Analysis (RCWA). This algorithm uses knowledge of the optical properties of the materials used, which may mean the values are estimated. In order to describe the spectra accurately, typically between 80 and 800 data points corresponding to different spectral angles or wavelengths are used to describe each spectrum.

Referring to step S53, spectral analysis, preferably Principal Component Analysis, is then used to reduce the amount of data which is considered in the subsequent iterative procedure. This statistical technique uses spectral basis functions which are determined on the basis of variations in the calculated spectra produced in step S52. The technique relies on the principle that all spectra in a set can be described as a sum of a number of principal components each of the principal components having for each spectrum a particular weighting factor, that is a principal component coefficient. Other spectral analysis techniques which could be used include Fourier analysis, for a spectral scatterometer, or a breakdown in Zernike functions, for an angular resolved scatterometer. Principal Components Analysis has an advantage that no prior assumptions are made on the components but that for each application the components are determined in order of descending statistical relevance. As a consequence, the set of full spectra can be described accurately with only a limited number of components. Yet another alternative is using a neural network technique to determine the relationship between a limited number of coefficients and the spectra in a set.

Figure 6:
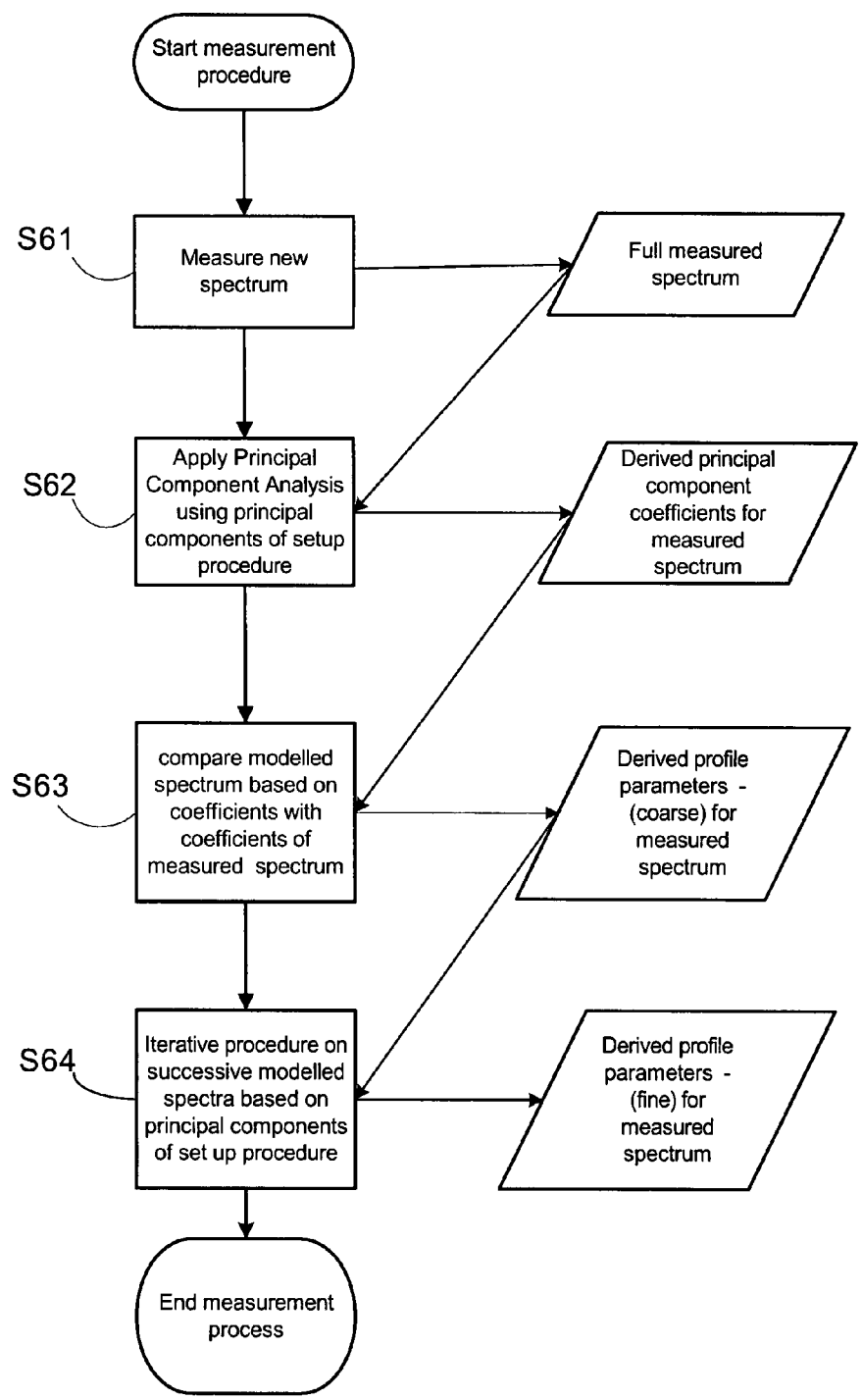
FIG. 6 depicts the measurement procedure of the method according to an embodiment of the invention.

Turning now to FIG. 6, the measurement procedure of measuring the scatterometry spectrum of a substrate and identifying the values of the structure parameters of the measured spectrum using an iteration procedure based on spectra modeled using the principal components derived in the set up procedure is depicted.

In step S61 a radiation beam is directed onto the substrate as indicated in FIG. 2 above, to produce a full spectrum measured over a range of wavelengths or angles.

In step S62, Principal Component Analysis, using the same principal components as those derived in the set up procedure described above, is used to derive the principal component coefficients of the measured spectrum.

In step S63, a comparison is made between the principal component coefficients of the measured spectrum and the calculated spectra based on a set of principal component coefficients which are in turn, based on the principal components derived in the set up procedure. This then produces a first set of derived profile parameters of the measured spectrum on the basis of the coarse mesh parameters.

In step S64 iteration between the parameter values is used to refine the search using between 5 and 20 data points per spectrum with modeled values of the coefficients. The output of this step is to define more accurate profile parameters for the measured spectrum, without the necessity of calculating the coefficients of the fine mesh and performing the comparison for each fine mesh value. The use of Principal Component Analysis has an advantage that the differences between the values of the stored coefficients and the coefficients for the measured spectra can be monitored to detect "out of range" spectra to exclude those spectra from further processing, preventing the risk of non-converging iterations.

When an iteration strategy is used to determine the profile parameters that give the best match between calculated and measured spectra, only a limited number of coefficients are needed to describe a spectrum that belongs to the spectrum-space spanned in the set up procedure as there is a linear relation between these coefficients and the spectral values at any points in the spectrum. Therefore, for each set of profile parameter values, it is sufficient to calculate only the same limited number of points of the spectrum and use the inverse of the linear relation between the spectra and the principal components to determine the coefficients. The coefficients and the principal components may then be used to reconstruct the full spectrum for the chosen profile parameter values. Thus, the use of principal components allows the reduction of the number of spectral points in the model calculations to typically 20, without having to select only the most relevant spectral points of the measured spectrum and having to discard valuable information in the other less relevant parts of the spectrum.

Figure 7:
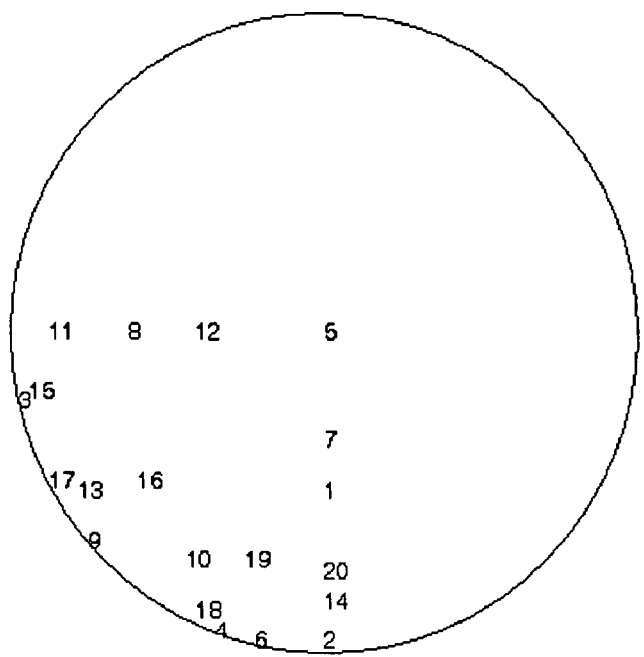
FIG. 7 depicts the selection of 20 calculation points within a spectrum in accordance with an embodiment of the invention.

Turning now also to FIG. 7, due to the fact that the calculated spectra are essentially noise free, they can be very accurately described by a limited number of principal components. Having determined those principal components which will be used, it is not necessary to calculate the full spectra for all values of spectral angle or wavelength in order to determine the principal component coefficients to be used to represent each calculated spectrum. Instead, it is sufficient to select a number of spectral angles or wavelength. It has already been mentioned that the value of a spectrum at any point can be described very accurately by a linear combination of a limited number of components. When the number of selected points is at least equal to the number of components, a (pseudo)inverse of that linear relation can be calculated. The number and position of these data points to be used may be optimized using a pivoting technique. Calculation of the spectral values at 20 to 40 data points may be sufficient to determine the principal component coefficients of 20 principal components for each spectrum in the set.

Figure 8:
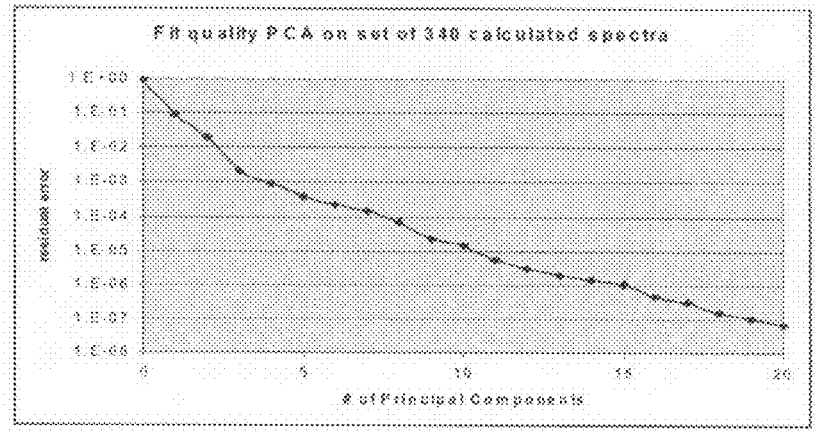
FIG. 8 depicts the relationship between the number of principal components and the relative error between calculated spectra and the spectra described by the principal components.

FIG. 8 shows the error which is produced between each of the calculated spectra and the full model spectra as a function of the number of principal components used. As can be seen from this figure where the spectrum is based on at least 20 principal components, the residual error between 340 calculated spectra using a full model and the model based on a limited number of principal components, reduces to an acceptable level.

It will be appreciated that while in the first embodiment, the iterative process is performed on the basis of the principal component coefficients, the iterative procedure may take place on spectra calculated on the basis of the coefficients.

SECOND EMBODIMENT

In accordance with second and third embodiments of the invention, statistical data reduction is combined with the library set up procedure. The spectra to be stored in the library are calculated using a model based on a mesh of different values of one or more selected profile parameters, for example line width of the target. The calculated spectra are used to derive a set of principal components, using Principal Component Analysis. In the particular application of scatterometry spectra, a limited set of principal components is sufficient to describe each spectrum in the set of stored spectra with the desired accuracy. Typically, each spectrum in the library can be described by a linear combination of, for example, the first 10 to 20 principal components found by analyzing the calculated spectra as in the first embodiment, each principal component being weighted by a respective coefficient. This is due to the fact that only a limited number of profile parameters contribute to changes in the calculation of the spectra. The coefficients of the linear combination of the principal components are different for each spectrum in the library. The principal components are specific for each library and have to be redetermined for a library based upon a different profile or a different set of profile parameters.

Figure 9:
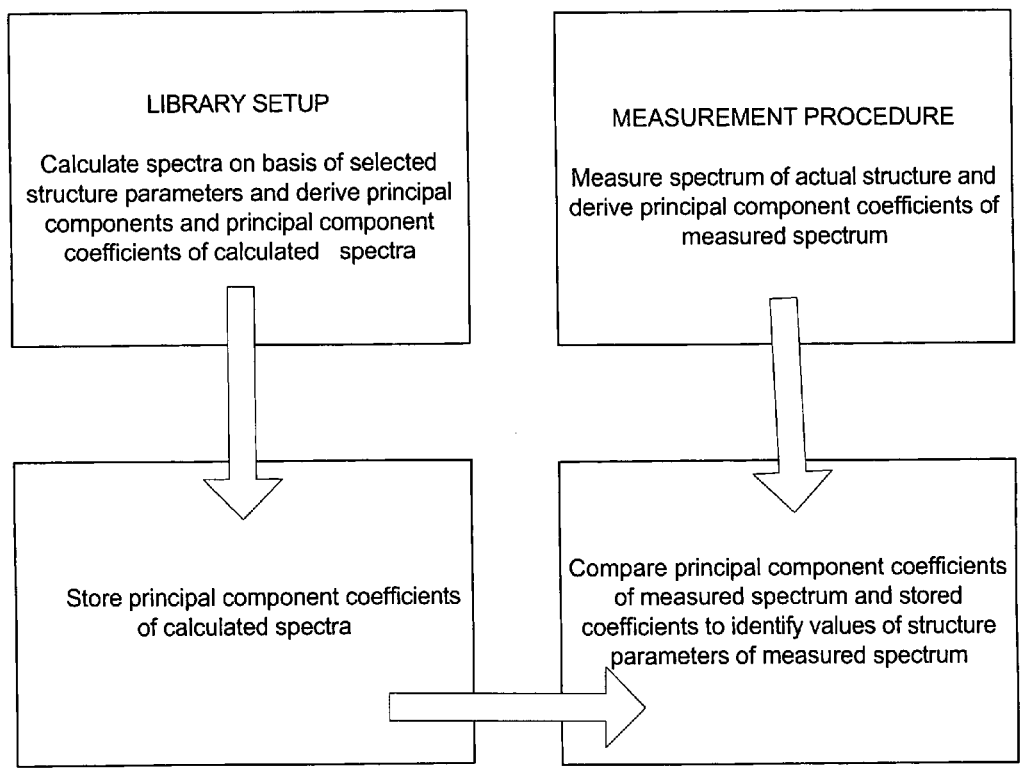
FIG. 9 depicts an overview of a method according to an embodiment of the invention.

In the second embodiment as indicated in the overview of the method shown in FIG. 9, principal component coefficients of the principal components derived from calculated spectra are stored in a library. The coefficients are compared with the principal component coefficients of the same principal components of a measured spectrum. Instead of storing full spectra with typically between 80 and thousands of intensity values per spectrum as in prior arrangements, it is sufficient to store the set of, for example, 10 to 20 principal components as discussed above in relation to the first embodiment for the library as a whole, together with the same number of coefficients, per calculated spectrum.

Figure 10:
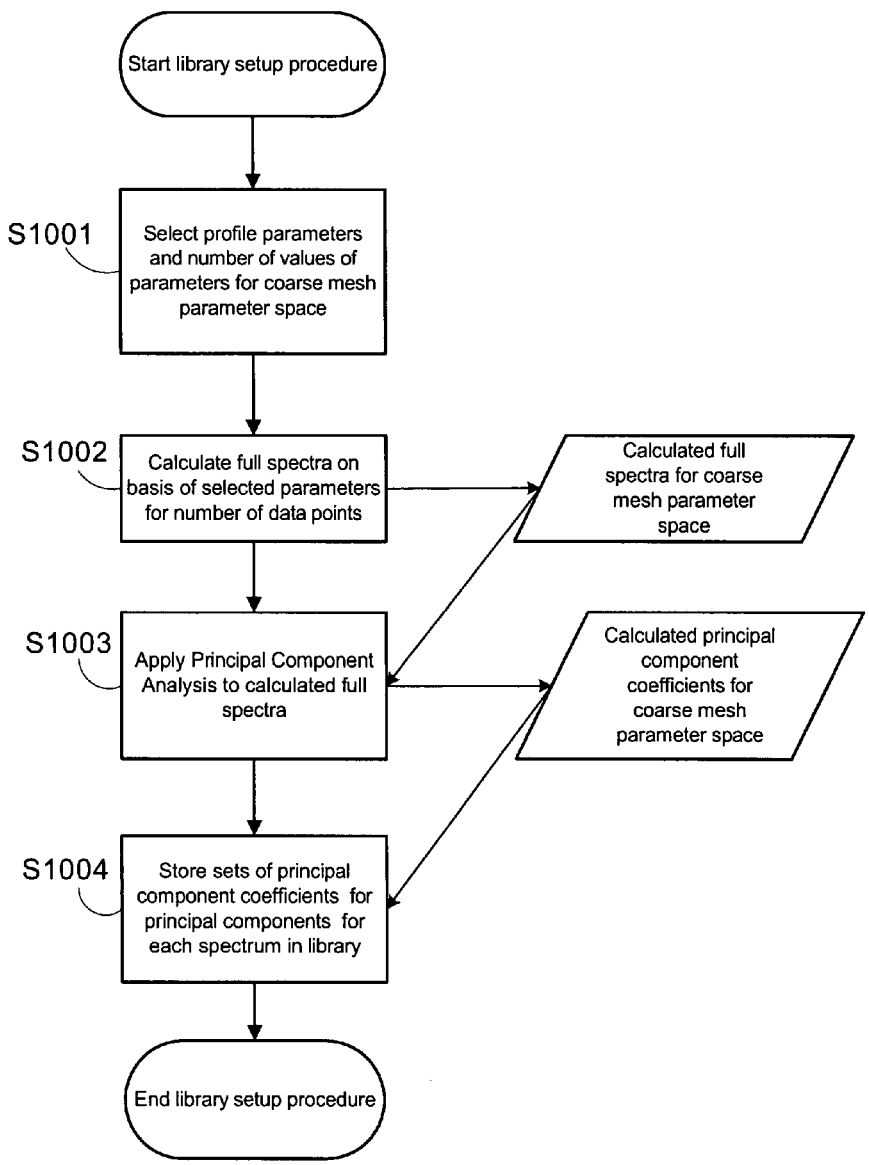
FIG. 10 depicts the library set up procedure used to produce data indicative of modeled spectra in accordance with an embodiment of the invention.

In the library set up procedure, as illustrated in FIG. 10, steps S1001, S1002 and S11003 are equivalent to steps S51, S52 and S53 of the set up procedure shown in FIG. 5. However, in step S1004, an indication of each of the principal components to be used to define all spectra in the set, together with the associated principal component coefficients for each particular spectrum in the set, are stored for each of the spectra in the library.

Figure 11:
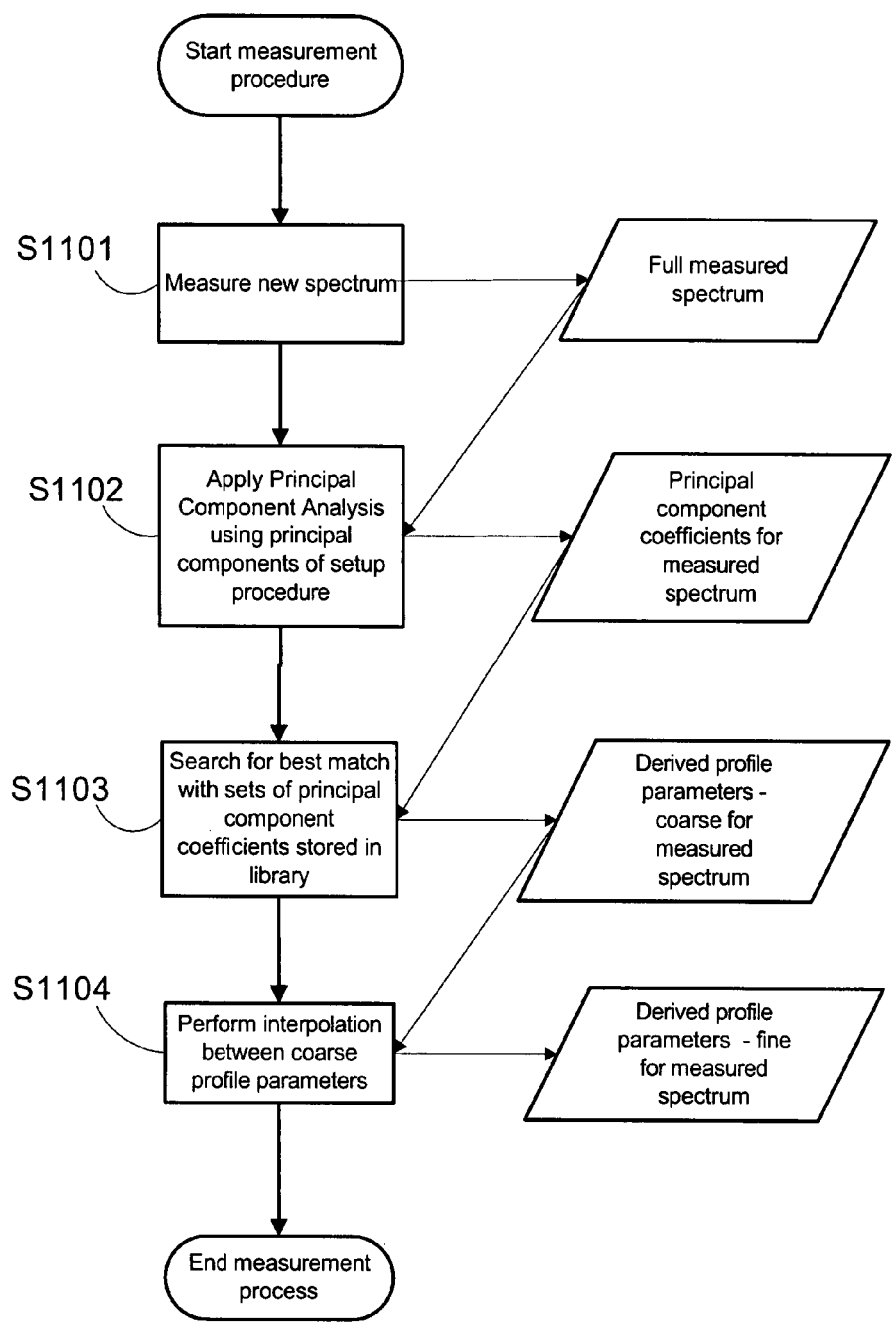
FIG. 11 depicts the measurement procedure used to define the profile parameters for a measured spectrum in accordance with an embodiment of the invention.

In the measurement procedure, as illustrated in FIG. 11, steps S1101 and S1102 are equivalent to steps S61 and S62 of the measurement procedure shown in FIG. 6. However in step S1103 a search is done among the principal component coefficients stored in the library, to derive the closest match and thus to derive the values of the selected parameters for the measured spectrum.

In step S1104, if required, a closer evaluation of the parameters can be obtained by interpolation of the coefficients in the library between mesh points with adjacent profile parameter values.

As explained above with reference to FIGS. 7 and 8, the calculated spectra may be very accurately described by a limited number of principal components. Having determined those principal components which will be used, it is sufficient to select a number of spectral angles or wavelengths where the spectral values need to be calculated. When the number of selected points is at least equal to the number of components, the principal component coefficients can be calculated using a linear relation, the (pseudo) inverse of the relation between coefficients and spectral values at these points. The number and position of these data points to be used may be optimized using a pivoting technique. Calculation of the spectral values at 20 to 40 data points may be sufficient to determine the principal component coefficients of 20 principal components for each spectrum in the set.

Figure 12:
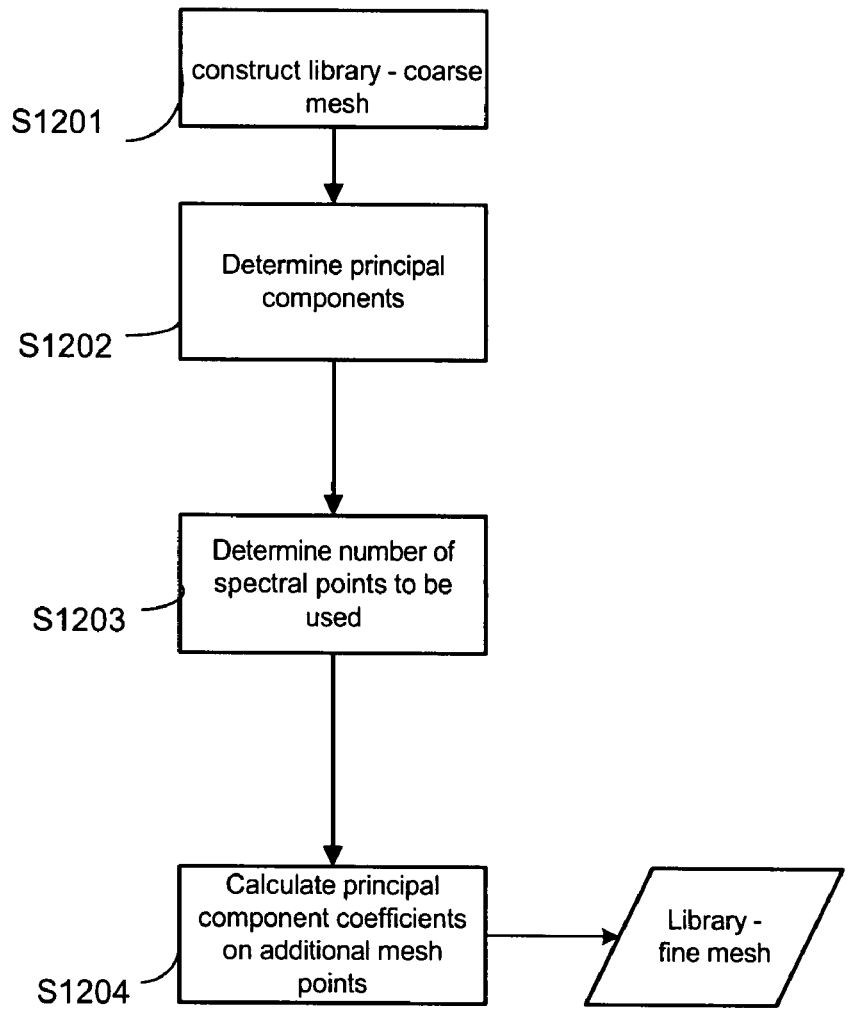
FIG. 12 depicts the formation of a library on a fine mesh from a library calculated on a coarse mesh.

The method where only a limited number of spectral points is used to determine the coefficients can be used to efficiently create a library on a fine mesh, as depicted in FIG. 12. First in step S1201 a library is constructed using a coarse mesh as described above. Then the principal components are determined in step S1202. The next step, S1203, is the determination of the limited number of spectral points to be used in further calculations. The next step, S1204, is the calculation of the principal component coefficients on additional mesh points to create a library of very fine mesh.

It will be appreciated that the storage size of the library in the form of principal components and coefficients is considerably smaller than when full spectra are stored. Also a search in the library can be executed faster. Further optimization is possible, using the specific properties of the principal components.

THIRD EMBODIMENT

A third embodiment of the invention, to be described, uses a combination of a library search method and an iterative search method. The statistical data reduction used in the library set up procedure may be used to calculate additional spectra very efficiently. These additional spectra can be used to generate more dense mesh of parameter values.

Figure 13:
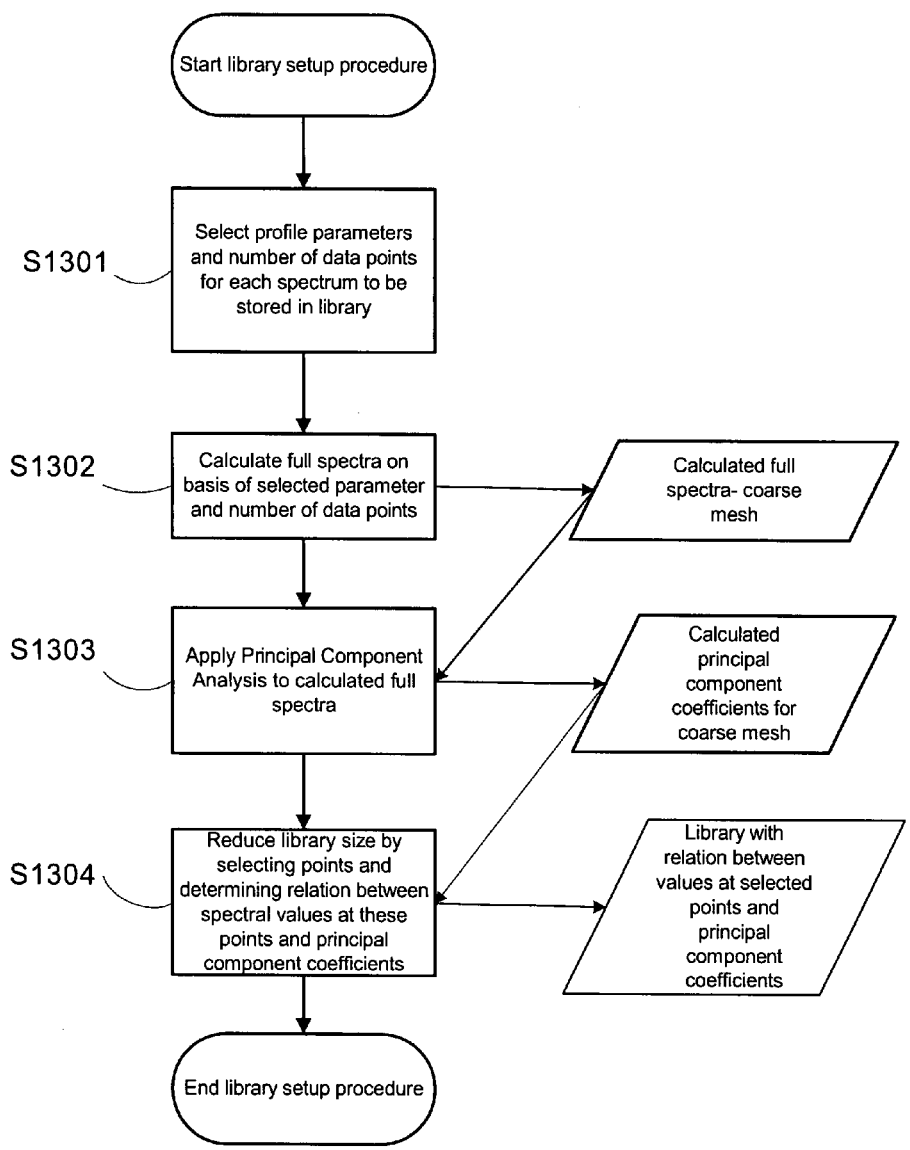
FIG. 13 depicts the library set up procedure used to produce data indicative of modeled spectra in accordance with an embodiment of the invention.

Turning to FIG. 13 which illustrates the library set up procedure of the third embodiment, steps S1301-S1303 are equivalent to steps S1001-S1003 in FIG. 10 relating to the second embodiment. In this particular example, the data stored in the library are actual stored modelled spectra. However as accuracy of the profile parameters is reached during a subsequent iteration procedure, it is only necessary to calculate and to store spectra based on the coefficients for, for example, 5 spectral components resulting in a smaller library size. Thus, in step S1304, the library size is reduced by selecting points and determining the relation between the spectral values and the principal component coefficients at those points. The library thus includes only the relation between the values and principal component coefficients at these selected points.

Figure 14:
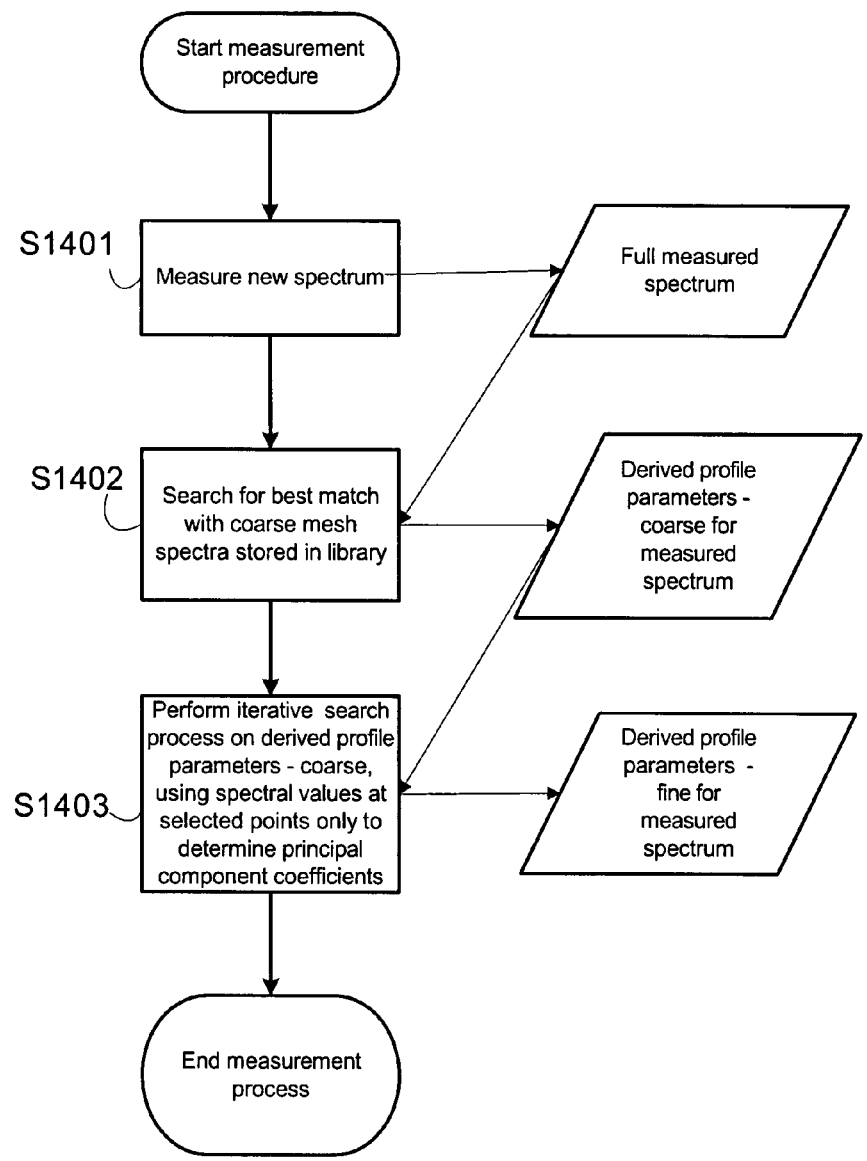
FIG. 14 depicts the measurement procedure used to define the profile parameters for a measured spectrum in accordance with an embodiment of the invention.

Turning now also to FIG. 14, in contrast to the measurement procedure of the second embodiment in which the principal component coefficients derived from the measured spectrum are compared with the stored principal component coefficients, the actual measured spectrum measured in steps S1401 are compared in step S1402 with the modelled spectra stored in the library which have been obtained by use of Principal Component Analysis of the modelled spectra. This procedure still achieves the objective of more efficient production of the additional spectra in the library set up procedure as, in step S1403, it is possible to perform an iteration search process based on the parameter values derived in step S1402 using the spectral values at selected points only to determine principal component analysis coefficients to obtain the profile values of the measured spectrum on a fine basis.

It will be appreciated that, while in this example of a combined library search method and iterative search method, data representative of modelled spectra are stored in the library, alternatively or additionally data representative of the derived principal components may be stored as in the second embodiment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiment as appropriate.

The invention claimed is:

1. A method of determining a structure parameter of a target pattern in a lithographic process used to manufacture a device layer on a substrate, the method comprising:

calculating a series of calibration spectra from a reference pattern, each spectra being calculated using a different known value of a structure parameter of the reference pattern;

performing spectral analysis on each calculated calibration spectra, for a selected number of points of the spectra, to obtain a common set of spectral components and a plurality of first sets of weighting factors, each first set of weighting factors representing one calculated spectrum;

measuring a target spectrum produced by directing a beam of radiation onto the target pattern;

performing spectral analysis on the measured target spectrum using the common set of spectral components obtained from the spectral analysis of the calculated calibration spectra to obtain a second set of weighting factors representing the measured target spectrum;

comparing a representation of the first set of weighting factors and a representation of the second set of weighting factors; and using the comparison to derive a value for the structure parameter of the target pattern.

2. The method of claim 1, wherein the common set of spectral components and the plurality of first sets of weighting factors are stored in a library and the stored first set of weighting factors are compared with the second set of weighting factors.

3. The method of claim 2, wherein further first sets of weighting factors for comparison with the second set of weighting factors are calculated using interpolation.

4. The method of claim 2, wherein, after using the comparison to derive a value for the structure parameter of the target pattern, further values of the structure parameter of the target pattern are derived using an iterative process.

5. The method of claim 1, wherein the representations of the first set of weighting factors and the second set of weighting factors are each modelled spectra.

6. The method of claim 1, wherein the common set of spectral components and one of the first sets of weighting factors are used as the basis of an iterative search method using a plurality of different parameter values to compare the first set of weighting factors and the second set of weighting factors.

7. The method of claim 1, wherein the structure parameter of the target pattern is a scatterometry parameter.

8. The method of claim 1, wherein the calibration spectra are calculated using Rigorous Coupled Wave Analysis.

9. The method of claim 1, wherein the spectral analysis is Principal Component Analysis.

10. The method of claim 1, wherein the calibration spectra are calculated over a limited number of points determined by the symmetry of the spectra.

11. An inspection apparatus configured to determine a value of a parameter of a lithographic process used to manufacture a device layer on a substrate, the apparatus comprising:

a calculation system arranged to calculate a series of calibration spectra from a reference pattern, each spectra being calculated using a different known value of a structure parameter of the reference pattern;

a first analysis system arranged to perform spectral analysis on each calculated calibration spectra, for a selected number of points of the spectra, to obtain a common set of spectral components and a plurality of first sets of weighting factors, each first set of weighting factors representing one calculated spectrum;

a measurement system arranged to direct a beam of radiation onto a target pattern on a substrate and to measure the spectrum;

a second analysis system arranged to perform spectral analysis on the measured spectrum using the common set of spectral components obtained from the spectral analysis of the calculated calibration spectra to obtain a second set of weighting factors representing the measured spectrum;

a comparison arrangement arranged to compare a representation of the first set of weighting factors and a representation of the second set of weighting factors; and a derivation arrangement arranged to use the output of the comparison arrangement to derive the value for the parameter of the lithographic process.

12. The inspection apparatus of claim 11, comprising a memory arranged to store a representation of the common set of spectral components and associated weighting factors representing each calculated spectra and wherein the comparison arrangement is arranged to compare the stored representation and the representation of the second set of the weighting factors.

13. The inspection apparatus of claim 11, comprising an iterative arrangement arranged to use one of the first sets of weighting factors as the basis of an iterative search method using a plurality of different parameter values to compare the first set of weighting factors and the second set of weighting factors.

14. A lithographic apparatus, comprising:

an illumination optical system arranged to illuminate a pattern;

a projection optical system arranged to project an image of a pattern onto a substrate; and an inspection apparatus configured to determine a value of a parameter of a lithographic process used to manufacture a device layer on a substrate, the apparatus comprising:

a calculation system arranged to calculate a series of calibration spectra from a reference pattern, each spectra being calculated using a different known value of a structure parameter of the reference pattern, a first analysis system arranged to perform spectral analysis on each calculated calibration spectra, for a selected number of points of the spectra, to obtain a common set of spectral components and a plurality of first sets of weighting factors, each first set of weighting factors representing one calculated spectrum, a measurement system arranged to direct a beam of radiation onto a target pattern on a substrate and to measure the spectrum, a second analysis system arranged to perform spectral analysis on the measured spectrum using the common set of spectral components obtained from the spectral analysis of the calculated calibration spectra to obtain a second set of weighting factors representing the measured spectrum, a comparison arrangement arranged to compare a representation of the first set of weighting factors and a representation of the second set of weighting factors, and a derivation arrangement arranged to use the output of the comparison arrangement to derive the value for the parameter of the lithographic process.

15. A lithographic cell comprising;

a coater arranged to coat a substrate with a radiation sensitive layer;

a lithographic apparatus arranged to expose an image onto the radiation sensitive layer of a substrate coated by the coater;

a developer arranged to develop an image exposed by the lithographic apparatus; and an inspection apparatus configured to determine a value of a parameter of a lithographic process used to manufacture a device layer on a substrate, the apparatus comprising:

a calculation system arranged to calculate a series of calibration spectra from a reference pattern, each spectra being calculated using a different known value of a structure parameter of the reference pattern, a first analysis system arranged to perform spectral analysis on each calculated calibration spectra, for a selected number of points of the spectra, to obtain a common set of spectral components and a plurality of first sets of weighting factors, each first set of weighting factors representing one calculated spectrum, a measurement system arranged to direct a beam of radiation onto a target pattern on a substrate and to measure the spectrum, a second analysis system arranged to perform spectral analysis on the measured spectrum using the common set of spectral components obtained from the spectral analysis of the calculated calibration spectra to obtain a second set of weighting factors representing the measured spectrum, a comparison arrangement arranged to compare a representation of the first set of weighting factors and a representation of the second set of weighting factors, and a derivation arrangement arranged to use the output of the comparison arrangement to derive the value for the parameter of the lithographic process.

16. A computer program for implementing a method of determining a structure parameter of a target pattern in a lithographic process used to manufacture a device layer on a substrate, the method comprising:

calculating a series of calibration spectra from a reference pattern, each spectra being calculated using a different known value of a structure parameter of the reference pattern;

performing spectral analysis on each calculated calibration spectra, for a selected number of points of the spectra, to obtain a common set of spectral components and a plurality of first sets of weighting factors, each first set of weighting factors representing one calculated spectrum;

performing spectral analysis on a spectrum measured from a target, using the common set of spectral components obtained from the spectral analysis of the calculated calibration spectra to obtain a second set of weighting factors representing the measured spectrum;

comparing a representation of the first set of weighting factors and a representation of the second set of weighting factors; and using the comparison to derive a value for the structure parameter of the target pattern.

\* \* \* \* \*

UNITED STATES PATENT AND TRADEMARK OFFICE
CERTIFICATE OF CORRECTION

| | | |
|---|---|---|
| PATENT NO. | : 7,460,237 B1 | Page 1 of 1 |
| APPLICATION NO. | : 11/882610 | |
| DATED | : December 2, 2008 | |
| INVENTOR(S) | : Hugo Augustinus Joseph Cramer | |

It is certified that error appears in the above-identified patent and that said Letters Patent is hereby corrected as shown below:

<u>Column 15</u>
Line 28 claim 5 please replace "modelled" with --modeled--.

Signed and Sealed this

Seventeenth Day of February, 2009

JOHN DOLL
*Acting Director of the United States Patent and Trademark Office*